United States Patent
Krivokapic et al.

(10) Patent No.: US 6,180,464 B1
(45) Date of Patent: Jan. 30, 2001

(54) METAL OXIDE SEMICONDUCTOR DEVICE WITH LOCALIZED LATERALLY DOPED CHANNEL

(75) Inventors: Zoran Krivokapic, Santa Clara; Ognjen Milic, Burlingame, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/198,352

(22) Filed: Nov. 24, 1998

(51) Int. Cl.$^7$ .................................................. H01L 21/336
(52) U.S. Cl. ..................... 438/289; 438/290; 438/291; 438/302; 438/174; 438/194; 438/217; 438/478; 438/510; 438/525; 438/527
(58) Field of Search ..................... 438/174, 194, 438/217, 276, 289, 290, 291, 302, 478, 510, 514, 525, 527

(56) References Cited

U.S. PATENT DOCUMENTS

| | | | |
|---|---|---|---|
| 4,841,346 | * | 6/1989 | Noguchi . |
| 5,478,763 | * | 12/1995 | Hong . |
| 5,500,379 | * | 3/1996 | Odake et al. . |
| 5,543,337 | * | 8/1996 | Yeh et al. . |
| 5,578,510 | * | 11/1996 | Tani . |
| 5,851,886 | * | 12/1998 | Peng . |
| 5,874,329 | * | 2/1999 | Neary et al. . |
| 5,893,740 | * | 4/1999 | Chang et al. . |
| 6,010,952 | * | 1/2000 | Tsai et al. . |
| 6,020,231 | * | 2/2000 | Wang et al. . |
| 6,020,244 | * | 2/2000 | Thompson et al. . |
| 6,025,232 | * | 2/2000 | Wu et al. . |
| 6,030,875 | * | 2/2000 | May et al. . |
| 6,051,860 | * | 4/2000 | Odananka et al. . |

OTHER PUBLICATIONS

Hori et al, A new p–channel MOSFET with Large–Tilt–Angle implanted punchthrough sptpper (LATIPS), IEEE Elect. Dev. Lett. vol. 9, No. 12, pp. 641–643, Dec. 1988.*

Hori et al, "A new half–micron p–channel MOSFET with LATIPS," IEEE IEDM pp. 394–397, 1988.*

Wolf, "Silicon processing for the VLSI era, vols. 1 and 2," pp. 325–327 and 309–311, 86/90.*

* cited by examiner

Primary Examiner—John F. Niebling
Assistant Examiner—Jonathan Hack

(57) ABSTRACT

Channel doping is implemented such that dopants remain localized under the gate without migrating under the source/drain juctions during processing, thereby avoiding performance degradation of the finished device. Embodiments include implanting impurities at an acute angle to form a lateral channel implant localized below the gate after activation of source/drain regions, and activating the lateral channel implant by a low-temperature RTA during subsequent metal silicide formation. The use of a low-temperature RTA for electrical activation of the lateral channel implant avoids impurity migration under the source/drain junctions, thereby lowering parasitic junction capacitance and enabling the manufacture of semiconductor devices exhibiting higher circuit speeds with improved threshold voltage control.

19 Claims, 7 Drawing Sheets

METAL OXIDE SEMICONDUCTOR DEVICE WITH LOCALIZED LATERALLY DOPED CHANNEL

FIELD OF THE INVENTION

The present invention relates to a method of manufacturing a metal oxide semiconductor device on a semiconductor substrate. The invention has particular applicability in manufacturing metal oxide semiconductor devices having localized channel doping.

BACKGROUND ART

Metal oxide semiconductor (MOS) devices typically comprise a pair of ion implanted source/drain regions in a semiconductor substrate an ion implanted channel region separating( the source/drain regions, and a thin gate oxide and a conductive gate formed above the channel region. A traditional approach to forming MOS devices comprises initially blanket doping the substrate with the intended channel implant before gate oxidation, forming the gate oxide and the gate, then counter-doping the source/drain regions and annealing to electrically activate the implants. However, this technique is problematic given the current demands for miniaturization and increased circuit density, which have led to a dramatic reduction in feature sizes. When feature sizes are scaled to below 1 $\mu$m, the traditional approach results in devices exhibiting undesirable short-channel effects, increased junction capacitance and mobility degradation (i.e. increased resistance) in the source/drain regions due to the presence of the unneeded heavy channel implant in the source/drain regions. Furthermore, during the annealing step, transient enhanced diffusion occurs, causing accelerated diffusion of source/drain dopants into the channel and out-diffusion of channel dopants to the source/drain regions, thereby decreasing the channel doping. To compensate, a higher initial channel doping concentration is necessary. However, raising the initial channel doping level further increases junction capacitance and degrades mobility in the source/drain regions.

As a result, the traditional approach is being largely replaced with newer methodologies. In one such technique, as illustrated in FIG. 1A a thin gate oxide 20 is first formed on a substrate 10 and a conductive gate 30. typically of polysilicon, is formed over gate oxide 20. Intended source/drain regions are then masked by masks 40, and the channel region 50 is ion implanted through gate 30 with impurities 60, as shown in FIG. 1B. Thereafter, as shown in FIG. 1C, a heavy source/drain implant is performed to implant impurities 70. The implants 60, 70 are then electrically activated by heating, as by rapid thermal annealing (RTA).

Disadvantageously, bombardment of the silicon of substrate 10 with a high flux of ions during the heavy source/drain implant causes crystallographic defects 80 in silicon 10 (i.e., holes in the crystal structure). Such defects. in turn, cause unwanted diffusion of implants 60, 70, especially during the RTA process. During such diffusion, channel dopants 60 migrate under the source/drain junctions J, and defects 80 attract dopants 70 to fill holes in the silicon crystal structure, as shown in FIG. 1D. The rise in doping level under the junctions J due the diffusion undesirably increases parasitic junction capacitance, thereby degrading device performance as by decreasing circuit speed. In addition, dopant migration from the channel region creates problems in controlling the threshold voltage of the finished device thereby lowering manufacturing yield.

There exists a need for methodology enabling the manufacture of semiconductor devices with channel doping localized under the gate, thereby reducing parasitic junction capacitance, improving device performance and increasing yield.

SUMMARY OF THE INVENTION

An advantage of the present invention is a method of manufacturing a semiconductor device having localized channel doping under the gate without dopant migration under the source/drain junctions during processing, thereby avoiding device degradation.

Additional advantages and other features of the present invention will be set forth in part in the description which follows and in part will become apparent to those having ordinary skill in the art upon examination of the following or may be learned from the practice of the present invention. The advantages of the present invention may be realized as particularly pointed out in the appended claims.

According to the present invention, the foregoing and other objects are achieved in part by a method of manufacturing a semiconductor device, which method comprises forming a polysilicon gate on a main surface of a semiconductor substrate; forming source/drain regions in the substrate having junctions with the substrate; heating to electrically activate the source/drain regions; ion implanting impurities at an acute angle into the substrate to form a lateral channel implant below the gate; and heating to electrically activate the lateral channel implant without substantially diffusing the lateral channel implant under the junctions.

Embodiments of the present invention include heating to activate the lateral channel implant at a temperature of about 800° C. or less. Advantageously, lateral channel implant activation can be implemented during subsequent silicidation of the gate electrode and/or source/drain regions.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description arc to be regarded as illustrative in nature, and not as restrictive.

BRIEF DESCRIPTION OF THE DRAWINGS

Reference is made to the attached drawings wherein elements having the same reference numeral designations represent like elements throughout, and wherein.

DESCRIPTION OF THE INVENTION

Conventional methodologies for manufacturing semiconductor devices undesirably result in diffusion of channel region dopants under source/drain junctions, thereby increasing parasitic junction capacitance, which degrades performance of the finished device. The present invention addresses and solves such problems stemming from conventional manufacturing processes.

According to embodiments of the present invention, a localized lateral channel implant is formed after activation of the source/drain regions. The localized lateral channel implant is subsequently activated at a temperature sufficiently low; e.g., about 800° C. or less, to avoid migration of the channel dopant under the source/drain junctions and also to avoid the diffusion of source/drain dopants into the channel. Such low temperature channel implant activation can be effected during subsequent processing, as during silicidation of the gate electrode and/or source/drain regions.

In an embodiment of the present invention, a conductive gate, such as a polysilicon gate, is formed on the main surface of a semiconductor substrate. As used throughout the present disclosure and claims the term "substrate" denotes a semiconductor substrate or an epitaxial layer formed on the semiconductor substrate. Source/drain regions are then formed, as by ion implantation, and electrically activated by heating, as by RTA. Impurities are thereafter implanted into the substrate, as by ion implantation, at an acute angle, e.g., an angle of about 32° to about 45° with respect to the substrate surface, to form a lateral channel implant below the gate. The lateral channel implant is then activated, as by a low-temperature RTA; e.g., during subsequent metal silicide formation. Since the low-temperature RTA is the only heating step to which the localized lateral channel implant is exposed for activation, the localized lateral channel implant does not substantially diffuse. In other words, the process flow employed in embodiments of the present invention results in substantially confining the localized channel implant under the gate without migration of the implanted impurities under source/drain junctions, thereby avoiding increased junction capacitance.

Figure 1A:
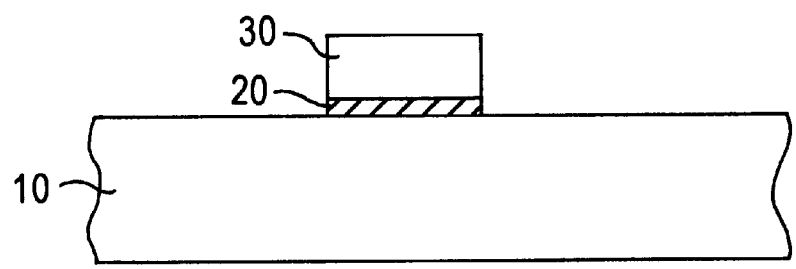
FIGS. 1A–1D schematically illustrate sequential phases of a conventional method of manufacturing a semiconductor device.
Figure 1B:
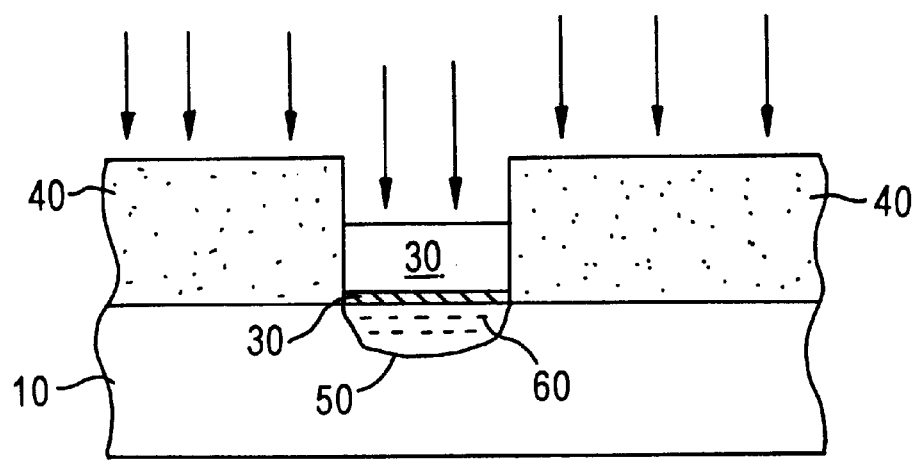
Figure 1C:
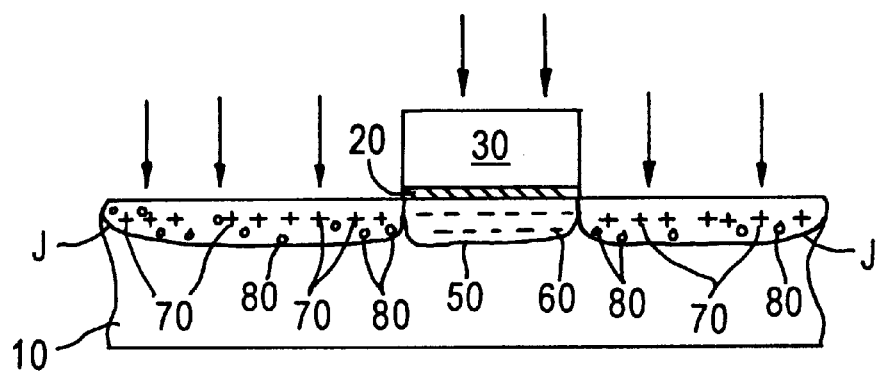
Figure 1D:
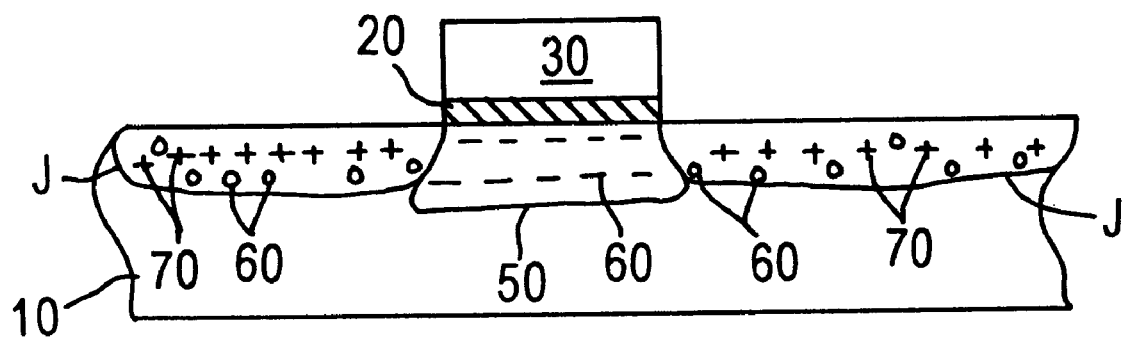
Figure 2A:
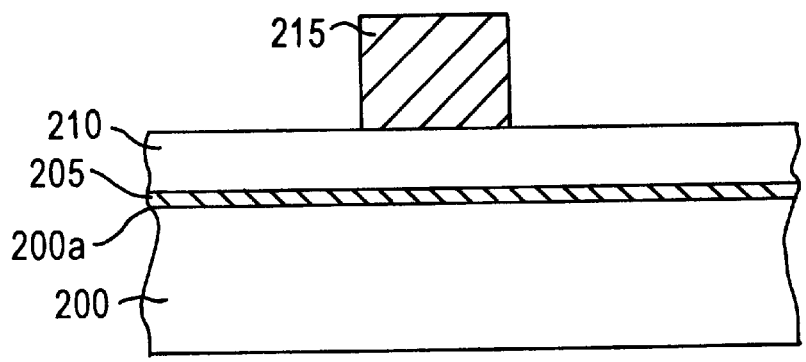
FIGS. 2A–2N schematically illustrate sequential phases of a method in accordance with an embodiment of the present invention.
Figure 2B:
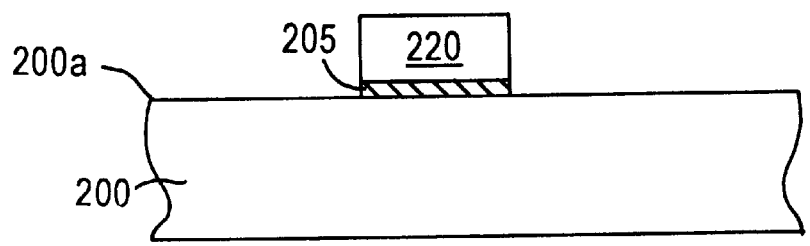
Figure 2C:
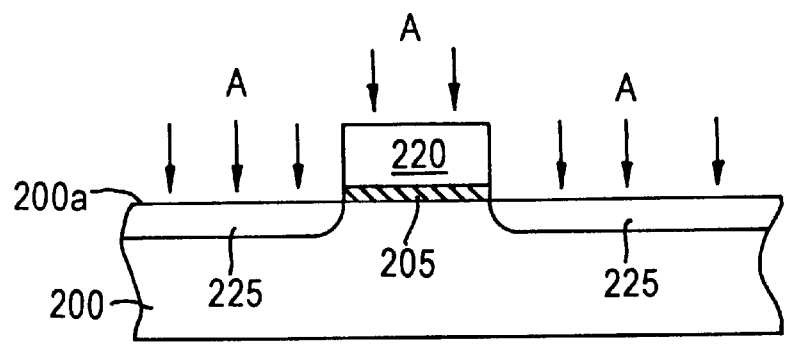
Figure 2D:
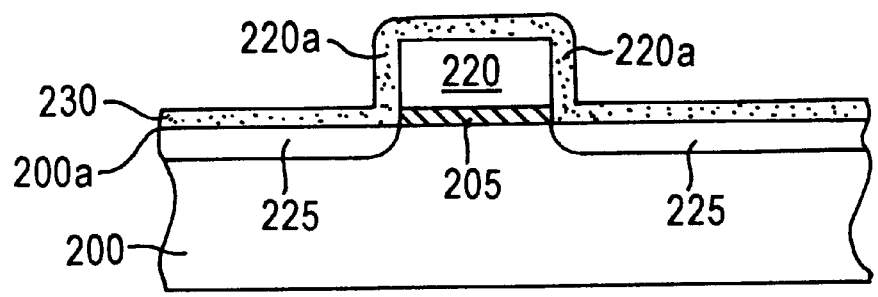
Figure 2E:
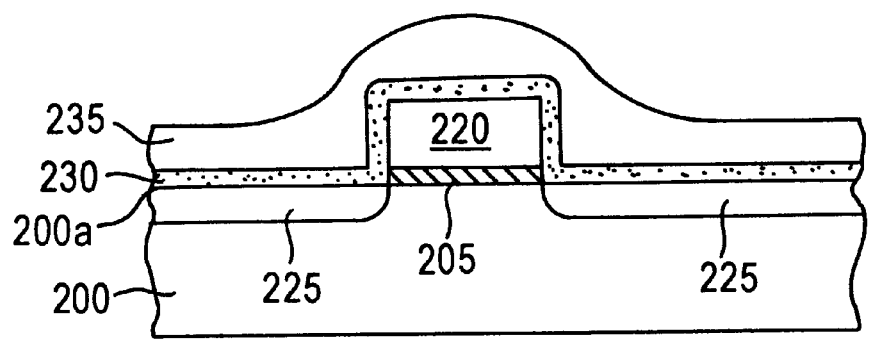
Figure 2F:
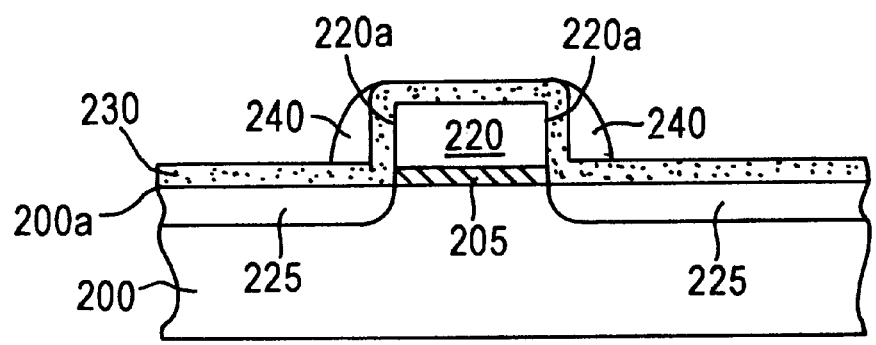
Figure 2G:
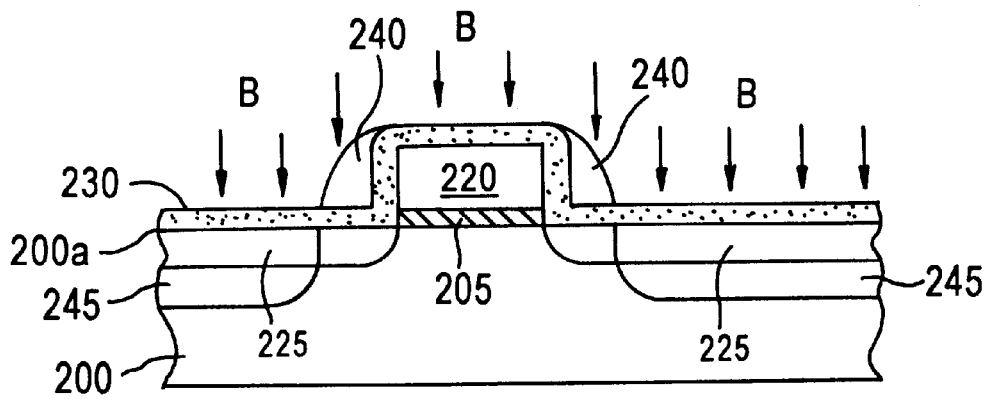
Figure 2H:
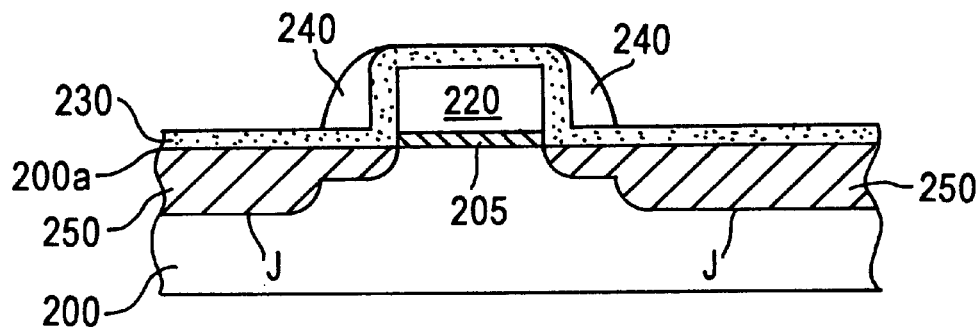
Figure 2I:
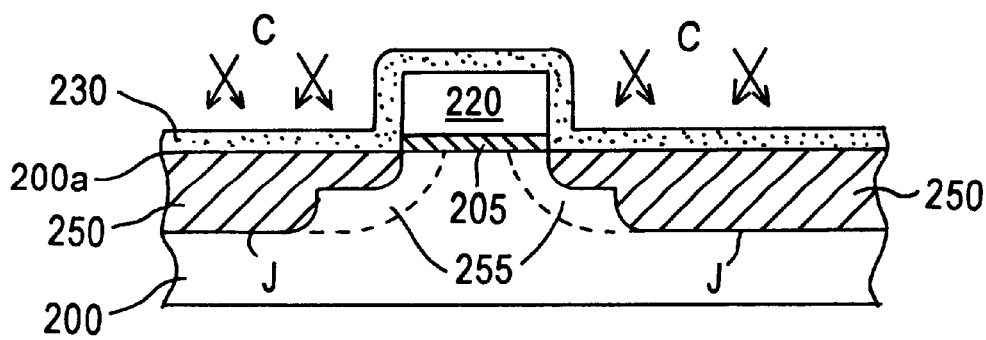
Figure 2J:
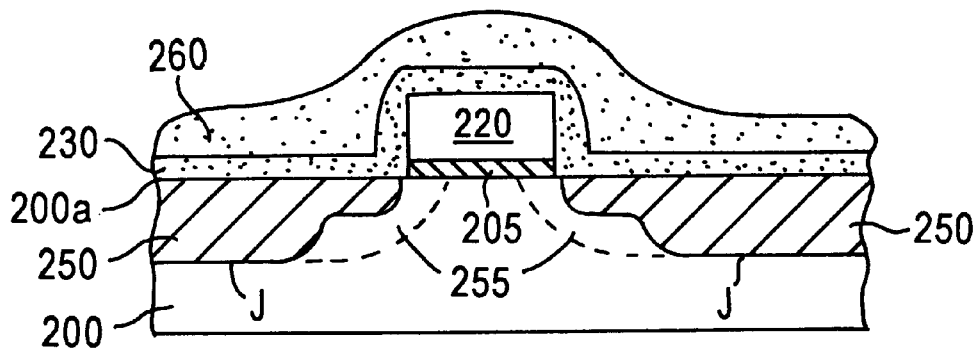
Figure 2K:
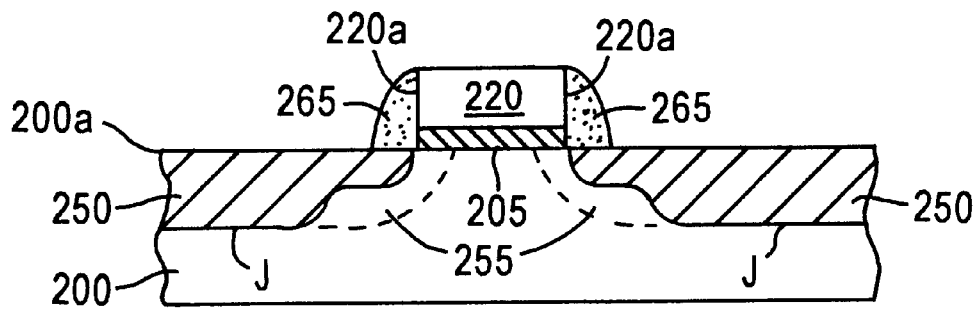
Figure 2L:
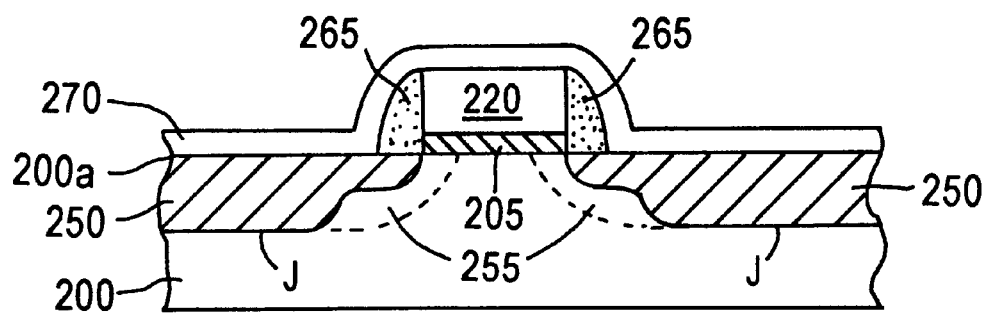
Figure 2M:
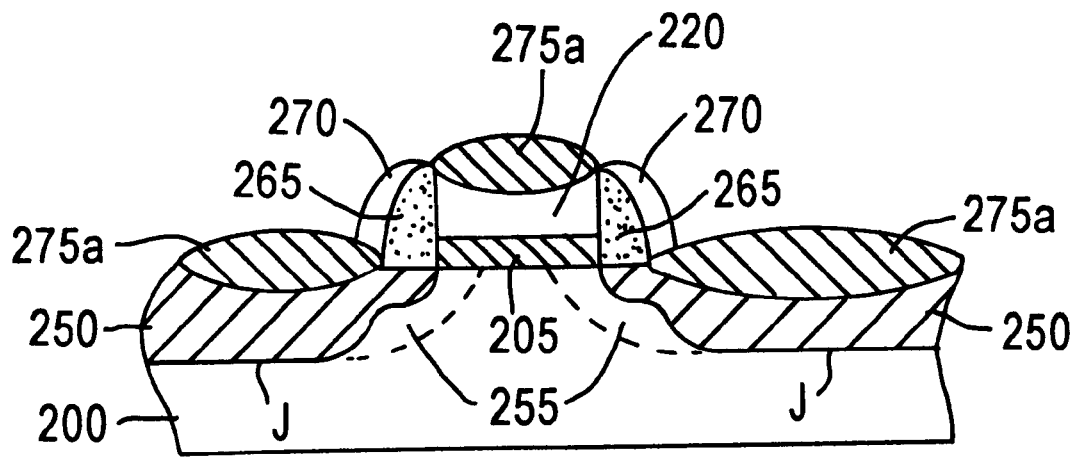
Figure 2N:
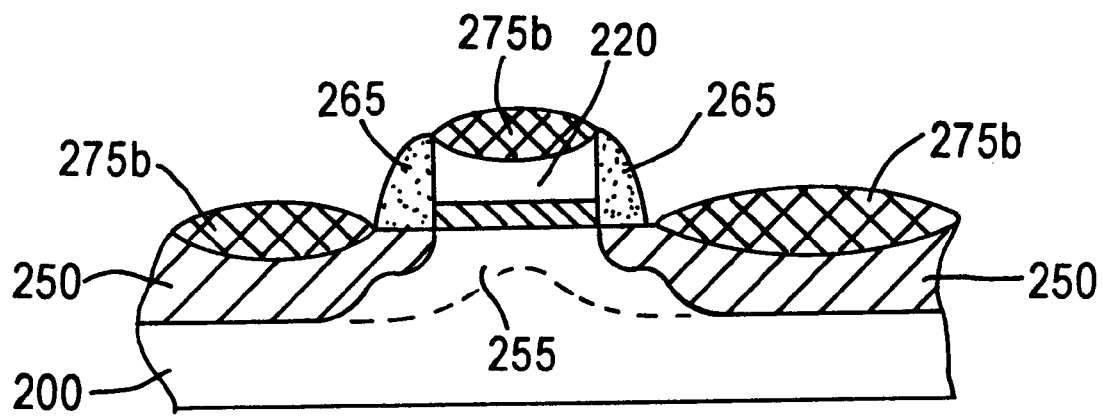

An embodiment of the present invention is illustrated in FIGS. 2A–2N, wherein sequential phases in forming a semiconductor device in accordance with the present invention are depicted. Referring to FIG. 2A, substrate 200 is prepared having a substantially planar surface, typically a semiconductor substrate comprising doped monocrystalline silicon or an epitaxial layer formed on a semiconductor substrate in accordance with conventional practices.

After formation of field isolation regions (not shown), gates are formed by first forming a thin gate oxide 205 on main surface 200a of substrate 200, as by thermal oxidation, followed by a polysilicon layer 210, as by low pressure chemical vapor deposition (LPCVD). A photoresist mask 215 is next formed on polysilicon layer 210 corresponding to the subsequently formed gates, and polysilicon layer 210 is etched, as by wet etching, to form gates 220 (see FIG. 2B).

Referring now to FIG. 2C, impurities A, such as $BF_2$, arsenic or antimony, depending on the desired conductivity type, are implanted into substrate 200, as by ion implantation at a dosage of about $5\times10^{13}$ atoms $cm^{-2}$ to about $2\times10^{14}$ atom $cm^{-2}$ and at an energy of about 2 keV to about 5 keV, to form lightly doped drain implants or source/drain extensions (LDD) 225.

Next, as depicted in FIG. 2D, a thin oxide buffer layer 230, such as silicon dioxide, is formed on main surface 200a and on gate 220, including sidewalls 220a of gate 220, by thermal oxidation or LPCVD to a thickness of about 30 Å to about 60 Å. A layer of silicon nitride 235 is then deposited (FIG. 2E), as by LPCVD, to a thickness of about 300 Å to about 600 Å, on buffer layer 230. Nitride layer 235 is thereafter anisotropically etched to form nitride spacers 240 on buffer layer 230 on sidewalls 220a, and extending onto buffer layer 230 on main surface 200a, as shown in FIG. 2F.

Referring now to FIG. 2G, impurities B such as boron, $BF_2$, indium, arsenic, phosphorus or antimony, depending on the desired conductivity type, are implanted into substrate 200, as by ion implantation, at a dosage of about $2\times10^{15}$ atoms $cm^{-2}$ to about $4\times10^{15}$ atom $cm^{-2}$ and at an energy of about 5 keV to about 8 keV, to form source/drain implants 245.

Next, LDD implants 225 and source/drain implants 245 are electrically activated by heating, as by RTA at a temperature of about 1020° C. to about 1050° C. for about 10 seconds to about 20 seconds. As depicted in FIG. 2H, the annealed source/drain regions 250 each have a junction J with substrate 200. In addition to electrically activating source/draining regions 250, annealing repairs crystallographic damage to the silicon of substrate 200 which occurred during LDD and source/drain ion implantation, thus reducing holes in the silicon structure which may cause subsequently implanted channel dopants to migrate under junctions J. Oxide buffer layer 230 prevents mechanical damage to substrate 200 during the annealing process which would otherwise occur due to the thermal mismatch between nitride spacers 240 and the silicon of substrate 200. By preventing the buildup of mechanical stress during RTA, buffer layer 230 largely avoids the introduction of stress-induced defects in substrate 200.

Referring to FIG. 2I, nitride spacers 240 are thereafter removed, as by wet etching with selectivity to oxide, leaving buffer layer 230 intact. Then, impurities C such as boron, $BF_2$, indium, arsenic, phosphorus or antimony, dependinig on the desired conductivity type, are implanted into substrate 200 at an acute angle of about 32° to about 45°, as by ion implantation, at a dosage of about $5\times10^{12}$ atoms $cm^{-2}$ to about $3\times10^{13}$ atom $cm^{-2}$ and at an energy of about 30 keV to about 80 keV, to form lateral channel implants 255 under gate 220.

A layer of silicon dioxide 260 is thereafter deposited, as by LPCVD, on buffer layer 230 (see FIG. 2J), and anisotropically etched, as shown in FIG. 2K, to form oxide spacers 265 on gate sidewalls 220a extending onto main surface 200a, and to remove exposed portions of buffer layer 230 from main surface 200a and the top of gate 205.

As depicted in FIG. 2L, a metal layer 270, such as titanium or cobalt, is then deposited on main surface 200a and gate 220, and a low-temperature RTA is then performed, at about 600° C. to about 650° C., to form a first-phase metal silicide layer 275a. such as CoSi or TiSi (see FIG. 2M). Portions of metal layer 270 on oxide spacers 265 do not react to form a silicide, and are stripped off. Referring to FIG. 2N, a second low-temperature RTA is performed, at about 700° C. to about 800° C., to convert first-phase metal silicide layer 275a to a second-phase metal silicide layer 275b, such as $CoSi_2$ or $TiSi_2$, having a resistivity lower than that of first-phase metal silicide layer 275. During the two-step silicidation process, lateral channel implant 255 is electrically activated and slightly further diffused in substrate 200. However, because lateral channel implant 255 is subjected to a relatively low temperature (i.e., a maximum of about 800° C.) during activation, there is substantially no diffusion of implanted channel impurities under source/drain junctions J.

The present methodology introduces a substantial fraction of the device's channel dopant after formation and activation of the source/drain regions 250. Since the low-temperature RTA of the two-step silicidation process is the only heating step that anneals and electrically activates lateral channel implant 255, it does not migrate under junctions J, as in prior art methodologies. By localizing the channel doping and, therefore, lowering parasitic source/drain junction capacitance compared to prior art devices, the present invention enables the manufacture of a faster semiconductor device, as well as improving threshold voltage control, thereby raising manufacturing throughput and yield. Furthermore, by performing electrical activation of the channel implant during the silicidation process, the number of process steps is reduced, thereby reducing manufacturing costs.

The present invention is applicable to the manufacture of various types of metal oxide semiconductor devices, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a polysilicon gate on a main surface of a semiconductor substrate;

forming source/drain regions in the substrate having junctions with the substrate;

heating to electrically activate the source/drain regions;

ion implanting impurities at an acute angle into the substrate to form a lateral channel implant below the gate after the step of heating to electrically activate the source/drain regions; and heating to electrically activate the lateral channel implant without substantially diffusing the lateral channel implant under the junctions.

2. The method according to claim 1, comprising implanting impurities at an angle of about 32° to about 45° to form the lateral channel implant.

3. The method according to claim 2, comprising implanting impurities at a dosage of about $5 \times 10^{12}$ atoms cm$^{-2}$ to about $3 \times 10^{13}$ atom cm$^{-2}$ and at an energy of about 30 keV to about 80 keV to form the lateral channel implant.

4. The method according to claim 3, comprising implanting boron, BF$_2$, indium, antimony, arsenic or phosphorus to form the lateral channel implant.

5. The method according to claim 1, comprising heating to electrically activate the lateral channel implant at a temperature of no greater than about 800° C.

6. The method according to claim 1, wherein the step of forming the polysilicon gate comprises:

thermally growing a gate oxide on the main surface;

depositing a blanket layer of polysilicon by LPCVD on the gate oxide;

masking a portion of the polysilicon layer corresponding to the polysilicon gate; and etching the polysilicon layer.

7. The method according to claim 1, wherein the step of forming the source/drain regions comprises:

ion implanting impurities into the substrate to form an LDD implant;

forming an oxide buffer layer on the main surface and on sidewalls of the gate;

forming first protective spacers on the buffer layer on the sidewalls of the gate and extending onto the main surface; and ion implanting impurities into the substrate to form a source/drain implant;

the method comprising removing the first protective spacers before forming the lateral channel implant.

8. The method according to claim 7, comprising implanting impurities at a dosage of about $5 \times 10^{13}$ atoms cm$^{-2}$ to about $2 \times 10^{14}$ atom cm$^{-2}$ and at an energy of about 2 keV to about 5 keV to form the LDD implant.

9. The method according to claim 8, comprising implanting BF$_2$, arsenic or antimony to form the LDD implant.

10. The method according to claim 7, wherein the step of forming an oxide buffer layer comprises thermally growing a layer of silicon dioxide to a thickness of about 30 Å to about 60 Å.

11. The method according to claim 7, wherein the step of forming an oxide buffer layer comprises depositing a layer of silicon dioxide to a thickness of about 30 Å to about 60 Å.

12. The method according to claim 7, wherein the step of forming the first protective spacers comprises:

forming a layer of silicon nitride on the buffer layer by LPCVD to a thickness of about 300 Å to about 600 Å; and anisotropically etching the silicon nitride layer.

13. The method according to claim 7, comprising implanting impurities at a dosage of about $2 \times 10^{15}$ atoms cm$^{-2}$ to about $4 \times 10^{15}$ atom cm$^{-2}$ and at an energy of about 2 keV to about 4 keV to form the source/drain implant.

14. The method according to claim 13, comprising implanting boron, BF$_2$, indium, antimony, arsenic or phosphorus to form the source/drain implant.

15. The method according to claim 1, wherein the step of heating to electrically activate the source/drain regions includes rapid thermal annealing at a temperature of about 1020° C. to about 1050° C. for about 10 seconds to about 20 seconds.

16. The method according to claim 7, further comprising:

forming a layer of silicon dioxide on the buffer layer after forming the lateral channel implant;

anisotropically etching the silicon dioxide layer to form second protective spacers on the sidewalls of the gate and extending onto the main surface, and to remove portions of the buffer layer on the main surface and the gate not covered by the second protective spacers;

forming a metal layer on the main surface and the gate; and heating to form a metal silicide layer and to electrically activate the lateral channel implant.

17. The method according to claim 16, wherein the step of heating to form a metal silicide layer comprises:

heating at a first temperature to form a first-phase metal silicide layer; and heating at a second temperature to form a second-phase metal silicide layer having a resistivity lower than that of the first-phase metal silicide layer.

18. The method according to claim 17, wherein the metal layer comprises cobalt or titanium, the first-phase metal silicide layer comprises CoSi or TiSi, and the second-phase metal silicide layer comprises $CoSi_2$ or $TiSi_2$.

19. The method according to claim 18, wherein the step of heating at the first temperature includes rapid thermal annealing at about 600° C. to about 650° C., and the step of heating at the second temperature includes rapid thermal annealing at about 700° C. to about 800° C.

* * * * *